United States Patent
Barnhart et al.

(10) Patent No.: US 6,567,943 B1
(45) Date of Patent: May 20, 2003

(54) D FLIP-FLOP STRUCTURE WITH FLUSH PATH FOR HIGH-SPEED BOUNDARY SCAN APPLICATIONS

(75) Inventors: Carl Frederick Barnhart, Tucson, AZ (US); David Lackey, Jericho, VT (US); Steven Frederick Oakland, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/545,369

(22) Filed: Apr. 7, 2000

(65) Prior Publication Data
(65)

(51) Int. Cl.[7] .............................................. G01R 31/28
(52) U.S. Cl. ...................................................... 714/727
(58) Field of Search ................................ 714/727, 731, 714/724

(56) References Cited

U.S. PATENT DOCUMENTS

| | | | |
|---|---|---|---|
| 4,628,216 A | | 12/1986 | Mazumder |
| 5,042,034 A | | 8/1991 | Correale, Jr. et al. |
| 5,056,094 A | * | 10/1991 | Whetsel ...................... 714/724 |
| 5,602,855 A | * | 2/1997 | Whetsel, Jr. ................ 324/73.1 |
| 5,615,217 A | | 3/1997 | Horne et al. |
| 5,631,911 A | * | 5/1997 | Whetsel, Jr. ................ 324/73.1 |
| 5,719,879 A | | 2/1998 | Gillis et al. |
| 5,867,507 A | * | 2/1999 | Beebe et al. ................. 714/726 |
| 5,920,575 A | | 7/1999 | Gregor et al. |
| 5,925,143 A | | 7/1999 | Gillis et al. |
| 5,938,782 A | | 8/1999 | Kay |
| 6,378,095 B1 | * | 4/2002 | Whetsel ....................... 714/30 |

OTHER PUBLICATIONS

Groves et al., "High–Performance CMOS Register", vol. 33, No. 3B, Aug. 1990, pp. 363–366.

* cited by examiner

Primary Examiner—Albert Decady
Assistant Examiner—Cynthia Britt
(74) Attorney, Agent, or Firm—Richard A. Henkler; Bracewell & Patterson, L.L.P.

(57) ABSTRACT

A boundary scan cell includes a shift latch, an update latch and a flushable latch that each have at least a respective data input and at least a respective data output. The data output of the shift latch is coupled to the data input of the update latch. The boundary scan cell further includes control circuitry that controls operation of the flushable latch circuit. The control circuitry selects, as input data for the flushable latch, one of a functional logic signal and a boundary scan signal in response to a mode signal. If the mode signal indicates a test mode, the control circuitry selects the boundary scan signal as the input data and causes the flushable latch to flush through the input data to the data output of the flushable latch independent of a system clock signal. The boundary scan cell can be implemented as either an input or output cell and preferably is compliant with IEEE Std 1149.1.

27 Claims, 4 Drawing Sheets

D FLIP-FLOP STRUCTURE WITH FLUSH PATH FOR HIGH-SPEED BOUNDARY SCAN APPLICATIONS

CROSS-REFERENCE TO RELATED APPLICATION

The present application is related to application Ser. No. 09/050,599, filed Mar. 30, 1998, and incorporated herein by reference as background material.

BACKGROUND OF THE INVENTION

1. Technical Field

The present invention relates in general to integrated circuitry and, in particular, to a boundary scan cell of an integrated circuit. Still more particularly, the present invention relates to a high-performance IEEE1149.1-compliant boundary scan cell of an integrated circuit.

2. Description of the Related Art

A significant expense incurred during the manufacture of circuit cards carrying one or more integrated circuit components is testing. Such testing generally entails stimulating the input/output (I/O) pins of a circuit card with a predetermined pattern of inputs and then observing the outputs generated by the components residing on the circuit card. Several factors contribute to the expense of circuit card testing. First, because many circuit card components do not employ a standard I/O interface, circuit card testing fixtures tend to be complex and must often be custom-designed to test particular circuit cards. Second, the input pattern utilized to stimulate a circuit card must often be generated manually in order to ensure that circuit card components are exercised over a sufficient range of functionality to ensure high quality. Third, while it may be less expensive for a circuit card or component manufacturer to out-source testing to an outside contractor, the use of non-standard component interfaces can require the component manufacturer to reveal proprietary information concerning the internal design of a component to the component tester, making many manufacturers reluctant to engage an outside contractor to perform testing.

In order to decrease the cost and increase the quality of component testing, the IEEE (Institute of Electrical and Electronic Engineers) adopted IEEE Std 1149.1, which is defined by the Standard Test Access Port and Boundary-Scan Architecture, *Institute of Electrical and Electronics Engineers* (May 21, 1990) and the 1149.1b-1994 Supplement, which are incorporated herein by reference. The IEEE1149.1 standard specifies that a boundary scan cell be inserted between the functional logic of a component and each of its input receiver and output driver circuits. These boundary scan cells, whose behavior is prescribed in detail by the IEEE1149.1 standard, are typically implemented with one or more 2-to-1 multiplexers in the direct path between the component's output flip-flop and driver or between the component's receiver and input flip-flop.

For example, referring now to FIG. 1, there is depicted a high level block diagram of a conventional high performance boundary scan cell 10 coupled to an edge-sensitive D flip-flop 14 for storing and launching data from system logic and a scan-path multiplexer 12. As shown, boundary scan cell 10 includes a mode multiplexer 16 in the path between D flip-flop 14 and the output buffer. Boundary scan cell 10 further includes a shift multiplexer 18, a shift latch 20 and an update latch 22. In operation, scan-path multiplexer 12 selects between the functional logic signal and scan path data in response to a scan enable (SE) signal. The output signal of scan-path multiplexer 12 is propagated through D flip-flop 14 to mode multiplexer 16, which selects either the output signal of D flip-flop 14 or the output signal of update latch 22 in response to the state of a MODE signal indicating whether the circuit is operating in test mode. As can be seen in FIG. 1, a conventional boundary scan cell subjects the functional logic signal to the delay of at least one 2-to-1 multiplexer between the system output flip-flop and the output buffer.

Thus, while the implementation of conventional IEEE1149.1-compliant interfaces within components facilitates higher quality, low cost testing without the need for disclosure of the internal circuitry of the components under test, these benefits come at the expense of performance due to the signal path delay associated with a multiplexer in the functional signal path and the loading associated with conventional boundary scan cells. Because of the performance penalty associated with conventional IEEE1149.1-compliant boundary scan cells, manufacturers have resisted compliance with the IEEE1149.1 standard.

To avoid the performance penalty associated with conventional boundary-scan cell implementations while still retaining compliance with the IEEE 1149.1 standard, efforts have recently been directed to reducing or eliminating the multiplexer delay described above. For example, U.S. Pat. No. 5,615,217 to Horne et al. discloses a method and apparatus for bypassing a boundary-scan cell during functional operation of an associated electronic component in order to avoid the component output signal traversing a multiplexer after a transition in the clock signal of the component. However, the solution proposed by Horne et al. still requires a multiplexer in the functional data path, which entails a concomitant delay that must be accounted for in meeting signal timing constraints. In addition, the scan path includes two multiplexers and two data latches, which adversely impacts testing performance. Another approach, which is disclosed in the application cross-referenced above, improves upon the conventional approach by implementing the output latch of the boundary-scan cell circuitry as an enhanced shift register latch (SRL) into which the function of the output multiplexer is merged. Although this approach improves upon the prior art by eliminating the output multiplexer, the resulting SRL does not provide as good of performance as other SRL configurations.

SUMMARY OF THE INVENTION

The present invention improves upon the prior art and overcomes the above-noted shortcomings in the art by providing an improved IEEE1149.1-compliant boundary scan cell that reduces the number of multiplexer delays in the functional signal path and supports high-performance testing.

In accordance with the present invention, a boundary scan cell includes a shift latch, an update latch and a flushable latch that each have at least a respective data input and at least a respective data output. The data output of the shift latch is coupled to the data input of the update latch. The boundary scan cell further includes control circuitry that controls operation of the flushable latch circuit. The control circuitry selects, as input data for the flushable latch, one of a functional logic signal and a boundary scan signal in response to a mode signal. If the mode signal indicates a test mode, the control circuitry selects the boundary scan signal as the input data and causes the flushable latch to flush through the input data to the data output of the flushable latch independent of a system clock signal. The boundary scan cell can be implemented as either an input or output cell and preferably is compliant with IEEE Std 1149.1.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DESCRIPTION OF ILLUSTRATIVE EMBODIMENT

Figure 1:
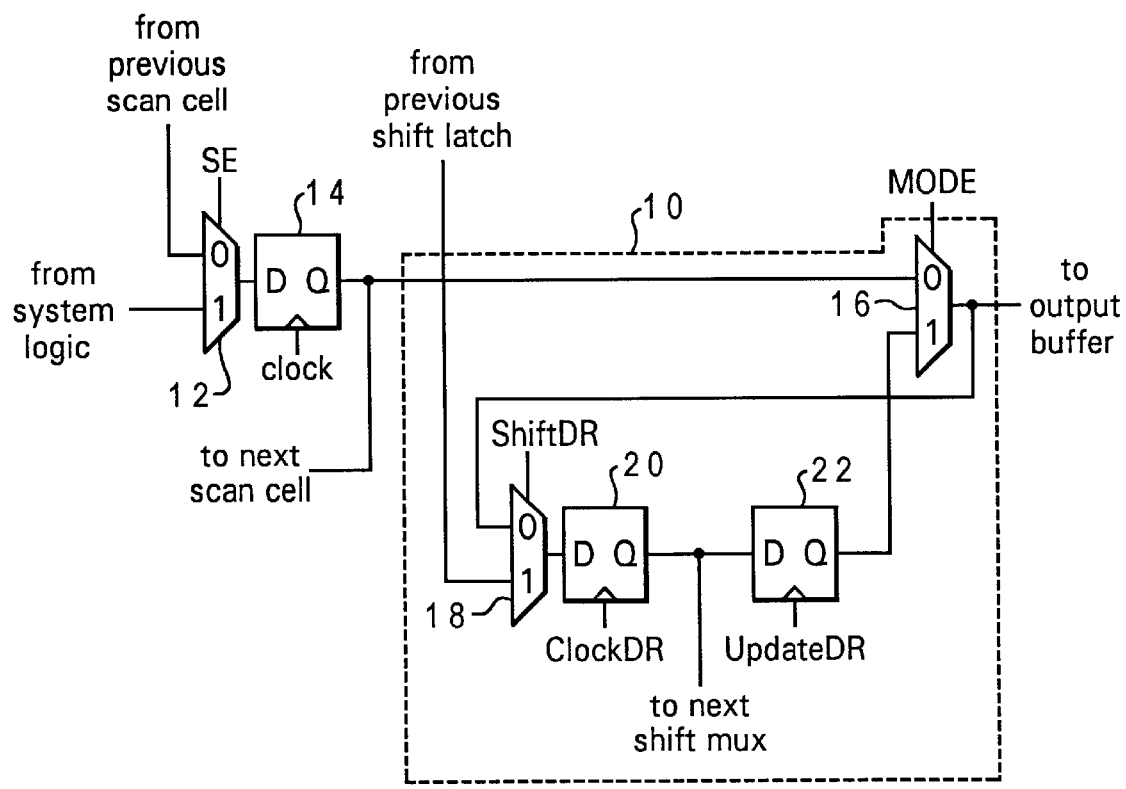
FIG. 1 illustrates a block diagram of a conventional IEEE1149.1-compliant boundary scan cell used in a high performance application.
Figure 2:
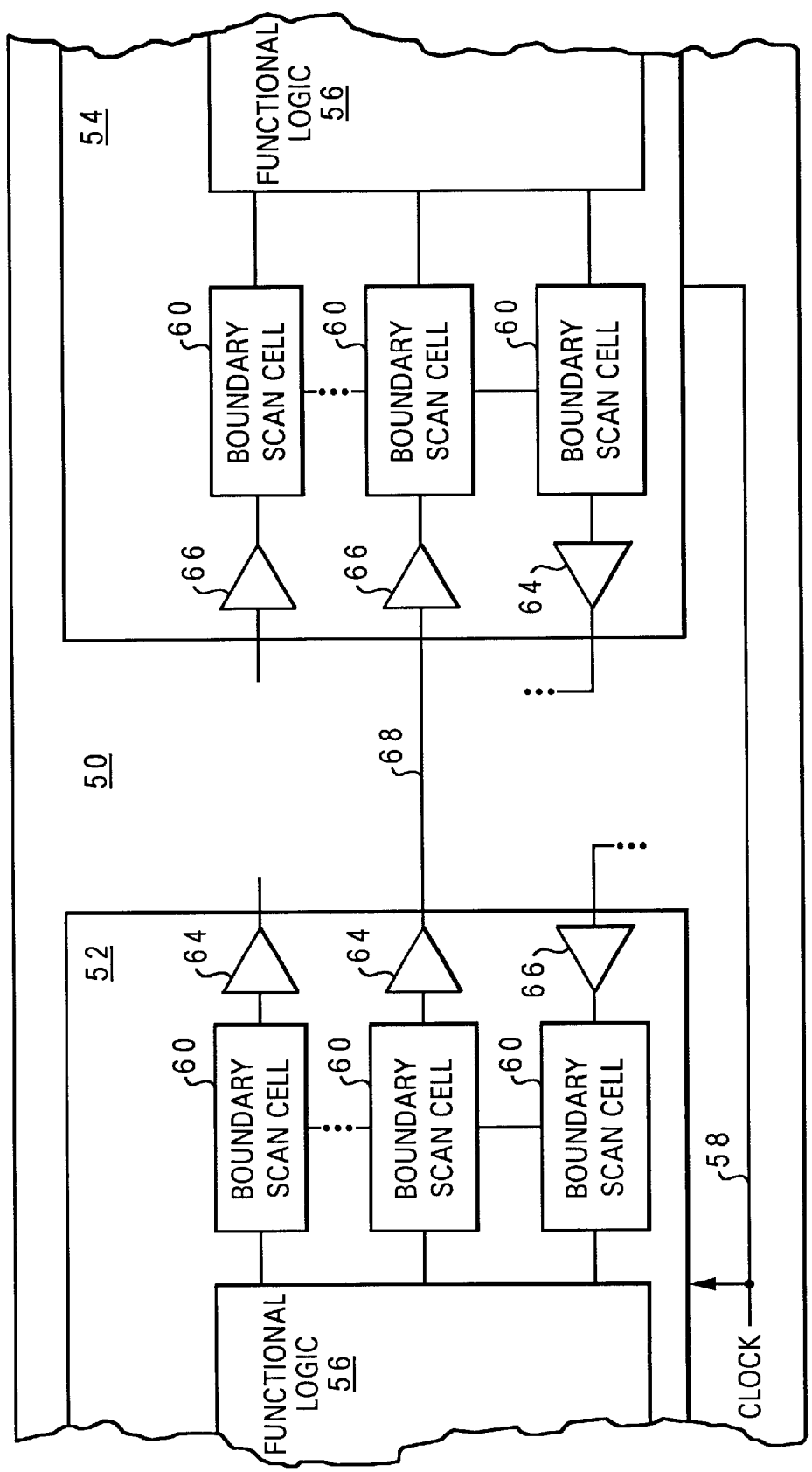
FIG. 2 depicts a high level block diagram of a circuit card on which are mounted interconnected integrated circuit chips that each include IEEE1149.1-compliant boundary scan cells in accordance with the present invention.

With reference again to the figures and in particular with reference to FIG. 2, there is depicted a high level block diagram of a circuit card 50 on which are mounted interconnected integrated circuit chips 52 and 54 in accordance with the present invention. The function of each of integrated circuit chips 52 and 54 is determined by its respective functional logic 56. For example, integrated circuit 52 may comprise a processor and integrated circuit chip 54 may comprise a cache memory, ASIC (Application Specific Integrated Circuit), or other support chip. In the illustrated embodiment, the operation of integrated circuit chips 52 and 54 is synchronized by clock signal 58.

In accordance with the IEEE1149.1 standard, a respective IEEE1149.1-compliant boundary scan cell 60 is coupled, via a driver 64 or a receiver 66, between each of the input/output (I/O) pins of integrated circuit chips 52 and 54 and functional logic 56. Of course, for bi-directional I/O pins, the associated boundary scan cell 60 would be coupled to both a driver 64 and a receiver 66. The boundary scan cells 60 within an integrated circuit chip 52 or 54 are further coupled together to form a scan chain for boundary scan testing, as is known in the art. The various I/O pins of integrated circuits 52 and 54 may also be coupled together by one or more interconnects 68 in order to propagate test, scan and functional signals between integrated circuit chips. As discussed further below, boundary scan cells 60 promote high speed functional and test mode operation by eliminating a multiplexer delay from the functional data path of each IC chip. Thus for interconnected IC chips, use of the present invention eliminates two multiplexer delays between the output of the flip-flop on the transmitting chip and the input of the flip-flop on the receiving chip.

Figure 3:
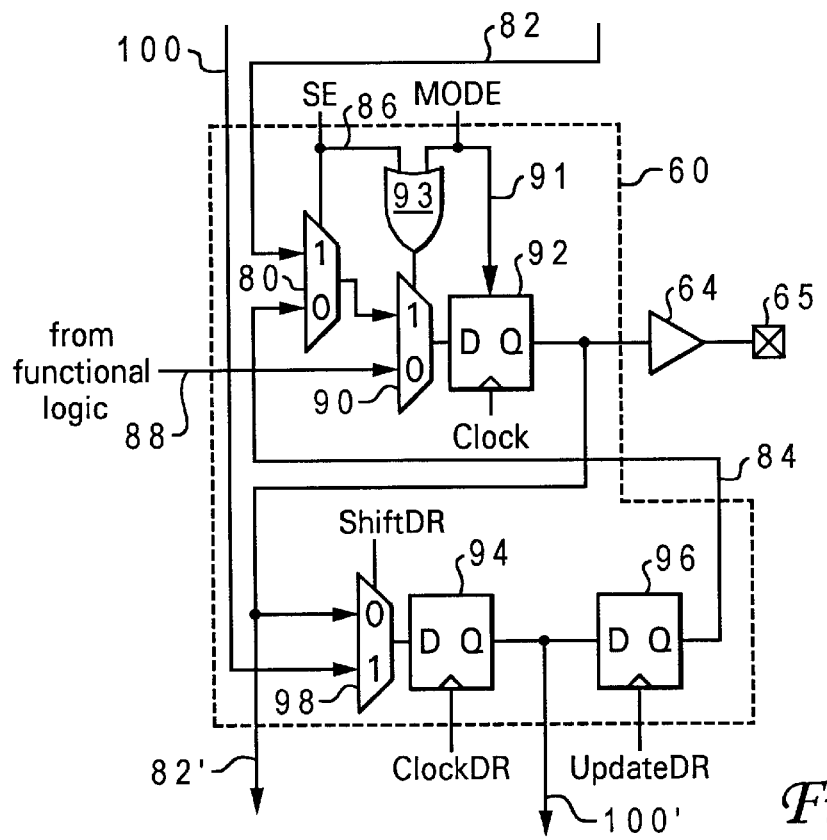
FIG. 3 is a block diagram of an flushable D flip-flop embodiment of a boundary scan cell in accordance with the present invention.

Referring now to FIG. 3, there is illustrated a flushable D flip-flop embodiment of an output boundary scan cell 60 of FIG. 2 in accordance with the present invention. In the depicted embodiment, boundary scan cell 60 includes a scan path multiplexer 80, which receives as inputs a scan input signal 82 from a previous boundary scan cell 60 and an update signal 84 and which selects one of these inputs as an output in response to a scan enable (SE) signal 86. SE signal 86 is logic high ("1") for scan mode operation and logic low ("0") for both test mode operation (which is indicated by MODE signal 91 being logic high) and functional mode operation (which is indicated by SE signal 86 and MODE signal 91 both being logic low).

Together with a functional logic signal 88, the output of scan enable multiplexer 80 forms an input of a mode multiplexer 90. The output of mode multiplexer 90, which is selected by the logical combination of a MODE signal 91 and SE signal 86 by OR gate 93, is connected to the input (D) of an innovative flushable D flip-flop 92. The output (Q) of flushable D flip-flop 92 is in turn connected, for output cells, to a driver 64. Of course, input cells, the output (Q) of D flip-flop 92 is connected to functional logic 56, and functional logic signal 88 is received from an input receiver 66.

In accordance with the IEEE1149.1 standard, boundary scan cell 60 includes two additional memory elements—a shift latch (e.g., D flip-flop) 94 and update latch (e.g., D flip-flop) 96. A shift multiplexer 98 selects either the functional data driven to driver 64 or shift register data 100 output from shift latch 94 in the previous boundary scan cell 60 as input data for shift latch 94. Of course, for input boundary scan cells 60, shift multiplexer 98 selects either functional logic signal 88 received from an input receiver 66 or shift register data 100 from shift latch 94 in the previous boundary scan cell 60 as input data for its shift latch 94.

For the functional mode of operation, both SE signal 86 and MODE signal 91 are logic low ("0"). Accordingly, mode multiplexer 90 passes functional logic signal 88 to the input (D) of flushable D flip-flop 92, which latches in and propagates data in a conventional manner in response to rising clock transitions. The signal propagated by flushable D flip-flop 92 is driven off-chip by driver 64 via package pin 65. Meanwhile, the output data propagated by flushable D flip-flop 92 may also be sampled by shift latch 94, propagated to a next boundary scan cell 60 as shift register data 100', and/or loaded into update latch 96 by appropriate selection of the states of the ShiftDR, ClockDR and UpdateDR signals defined by the IEEE1149.1 standard. It is important to note with respect to the functional mode of operation that the propagation of functional logic signal 88 to the output driver 64 is subject only to the clock-to-Q delay of flushable D flip-flop 92 and is not subject to a multiplexer delay.

To place boundary scan cells 60 into test mode, a test instruction, such as EXTEST, is loaded into the IEEE1149.1 Test Access Port (TAP). Upon decode of the test instruction, MODE signal 91 transitions logic high ("1") and scan enable signal 86 is held low. Thus, data in update latch 96 is propagated to package pin 65 through scan path multiplexer 80, mode multiplexer 90 and flushable D flip-flop 92. Importantly, a logic high MODE signal 91 sets flushable D flip-flop 92 into a flush state in which data is propagated through the flushable D flip-flop 92 from input (D) to output (Q) in the absence of a functional clock signal.

Figure 4:
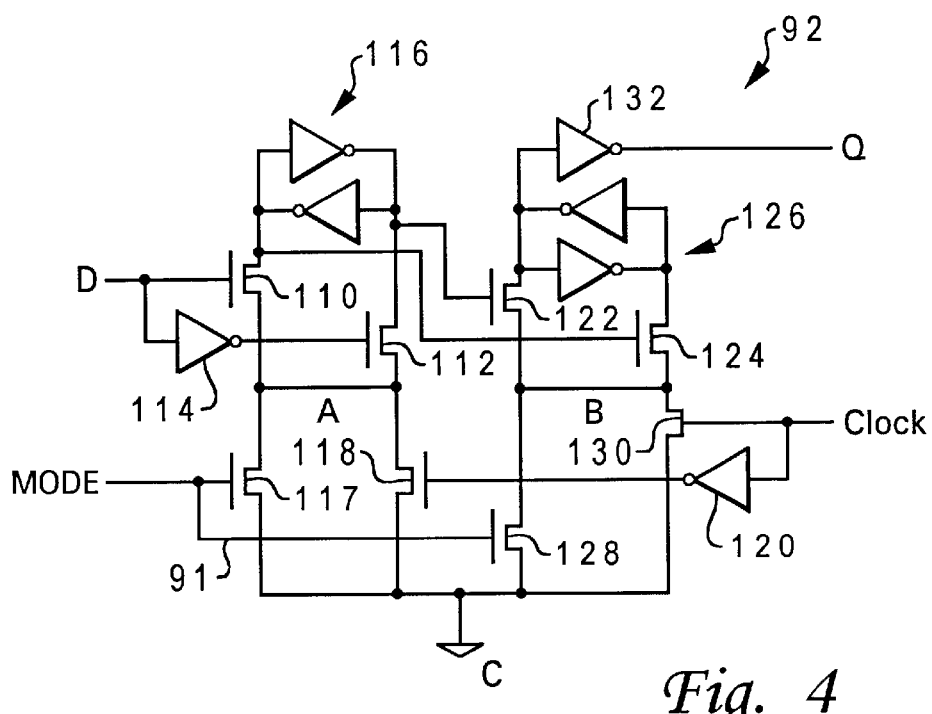
FIG. 4 is a circuit diagram of the flushable D flip-flop of FIG. 3.

With reference now to FIG. 4, there is depicted a circuit schematic of a MOS (Metal-Oxide-Semiconductor) implementation of a preferred embodiment of flushable D flip-flop 92 of FIG. 3. As illustrated, flushable D flip-flop 92 has an input D and an output Q. Input D is coupled to the gate of a first input transistor 110 and is also coupled, via an input inverter 114, to a second input transistor 112. Input transistors 110 and 112 are connected at a common node A and are each coupled to cross-coupled inverter pair 116. Common node A is coupled to ground node C by transistors 117 and 118, which are respectively controlled by the states of MODE signal 91 and the inverted clock signal produced by clock inverter 120.

On the output side, flushable D flip-flop 92 includes output transistors 122 and 124, which are each coupled to a second cross-coupled inverter pair 126 and connected to a common node B. The gates of output transistors 122 and 124 are connected to opposite ends of first cross-coupled inverter pair 116. Common node B is coupled to ground node C by transistors 128 and 130, which are respectively controlled by the states of MODE signal 91 and the clock signal. Flushable D flip-flop 92 finally includes an output inverter 132 connected to one end of second cross-coupled inverter pair 126.

In normal functional operation, MODE signal 91 is logic low, and output Q changes state in response to a change in the state of input D in response to the rising edge of the clock signal, as is conventional. However, if MODE signal 91 is logic high, output Q changes state in response to a change in state of input D even in the absence of the clock signal. For example, assuming that input D and output Q are logic low and input D transitions to logic high, input transistor 110 and transistor 117 will turn on, and input transistor 112 will turn off. Thus, first pair of cross-coupled inverters 116 will propagate a logic high signal to the gate of output transistor 122, and transistor 128 will be turned on by MODE signal 91. As a result, a logic low signal propagates to output inverter 132, which outputs a logic high. Importantly, the clock signal need not be functional when flushable D flip-flop is in the flush state (i.e., MODE signal 91 is logic high) in order for data to be flushed through.

Figure 5:
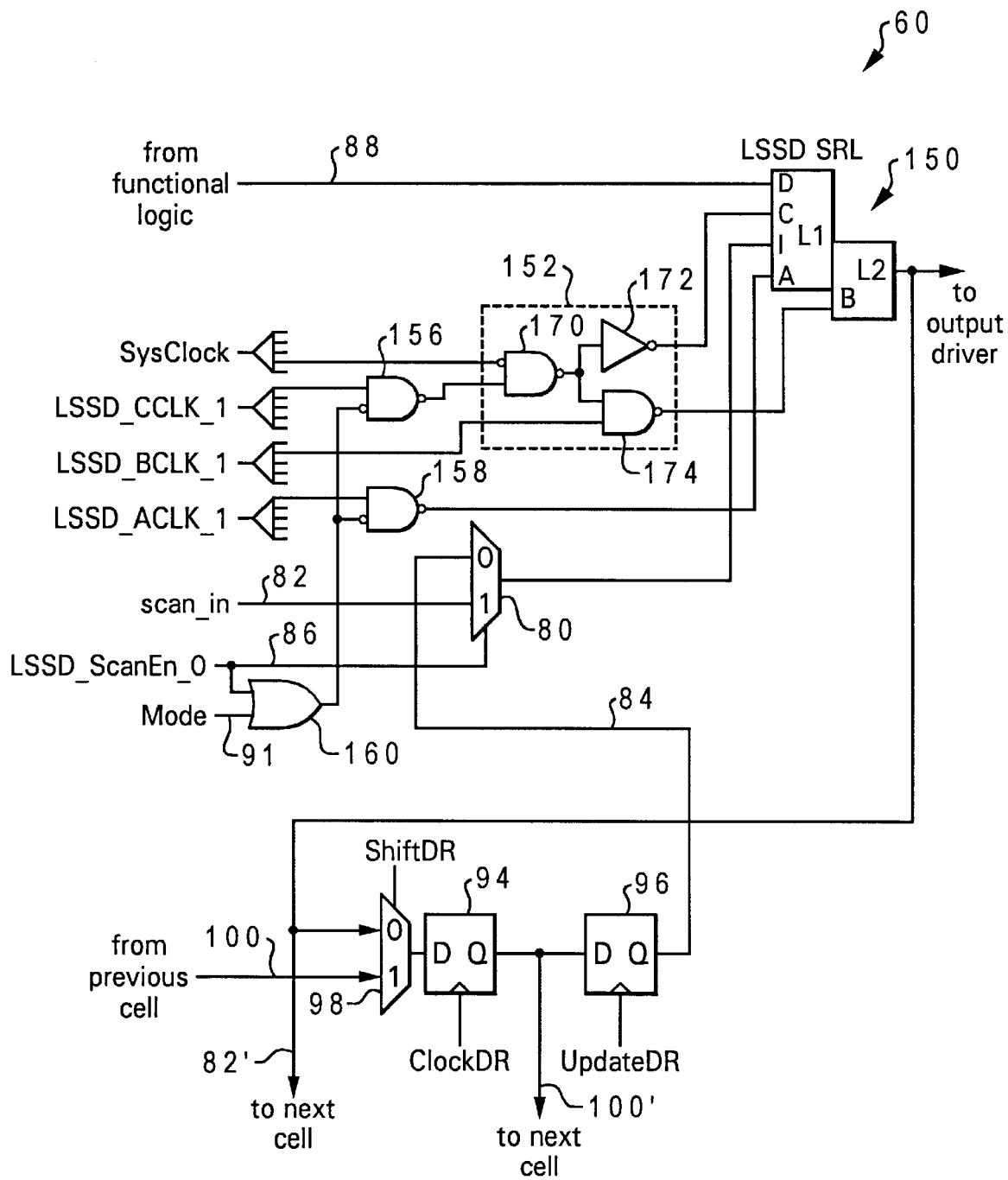
FIG. 5 is a block diagram of a flushable shift-register latch (SRL) embodiment of a boundary scan cell in accordance with the present invention.

Referring now to FIG. 5, there is illustrated a block diagram of a preferred implementation of a flushable shift-register latch (SRL) embodiment of an output boundary scan cell 60 in accordance with an alternative embodiment of the present invention. In FIG. 5 like reference numerals are utilized to identify signals and elements like those shown in FIG. 3. As shown, boundary scan cell 60 includes a level-sensitive scan design (LSSD) SRL 150, clock splitter logic 152, scan path multiplexer 80, and control logic comprising AND gates 156 and 158 and OR gate 160. In addition, boundary scan cell 60 includes shift multiplexer 98, shift latch 94 and update latch 96, as described above with respect to FIG. 3.

SRL 150 functionally comprises two transparent latches: a master latch L1 and a slave latch L2. SRL 150 is preferably implemented as a dual-port SRL, meaning that master latch L1 has a plurality of clock inputs (C and A) that are each associated with a respective one of multiple data inputs (D and I) such that the transition of a particular clock to an active state causes the master latch to be transparent to data present at the associated data input. In this manner, a first data input (D) can receive a functional logic signal 88 associated with normal functional operation, while a second data input (I) can be connected to scan path multiplexer 80 to provide a scannable register that a tester can utilize to scan test stimuli into SRL 150. Thus, when C=0 and A=1, master latch L1 is transparent to data at input I, and when C=1 and A=0, master latch is transparent to data at input D. Master latch L1 holds its data indefinitely if A=C=0.

Slave latch L2 is similarly operable as a transparent latch. When B=1, slave latch L2 is transparent to the data in master latch L1. On the other hand, when B=0, slave latch L2 holds its data indefinitely.

SRL 150 is operable as a D flip-flop through appropriate interconnection to clock splitter logic 152, which includes a NAND gate 170 having an inverter 172 and an AND gate 174 connected to its output. During normal functional operation, LSSD test clocks LSSD_ACLK_1, LSSD_BCLK_1 and LSSD_CCLK_1 are held to values 1, 1 and ⁻1, respectively, and LSSD_ScanEn_0 (SE) signal 86 and MODE signal 91 are both 0. As a result, master latch L1 is transparent when the system clock (SysClock) is low, while slave latch L2 holds the previous value. Then when SysClock transitions high, master latch L1 holds its previous value, and slave latch L2 becomes transparent. Thus, during normal functional operation, SRL 150 operates as a conventional D flip-flop. Importantly, during functional operation, the propagation of functional logic signal 88 to output driver 64 is subject to the B-to-L2 delay of SRL 150 and is not subject to a multiplexer delay.

During LSSD flush mode of operation, SE signal 86 is set to 1, and the LSSD test clocks LSSD_ACLK_1, LSSD_BCLK_1 and LSSD_CCLK_1 are held to values 1, 1 and 0. As a result, SRL 150 becomes transparent to data (i.e., scan input signal 82) present at the I input, and the data propagates through to the output of SRL 150.

During LSSD scan mode operation, SE signal 86 is set to 1, and the LSSD test clocks LSSD_ACLK_1, LSSD_BCLK_1, LSSD_CCLK_1 are initially all set to 0. As LSSD_ACLK_1 is pulsed high, master latch L1 is transparent to scan input signal 82 while slave latch L2 holds the previous value. Then when LSSD_BCLK_1 is pulsed high, master latch L1 holds its previous value, and slave latch L2 becomes transparent.

During test mode, LSSD_ACLK_1, LSSD_BCLK_1, LSSD_CCLK_1, and MODE signal 91 are all set to 1, and SE signal 86 is set to 0. As a result, boundary-scan data (i.e., update signal 84) passes through scan path multiplexer 80 and is flushed through SRL 150 from input I to the output of slave latch L2 since A=B=1. Thus, SRL 150 operates like flushable D flip-flop 92 in test mode.

As has been described, the present invention provides a high-performance IEEE1149.1-compliant input or output boundary scan cell including a flushable latch, such as a D flip-flop or an SRL. In accordance with the present invention, performance is improved relative to conventional boundary scan cell implementations by merging an component input or output flip-flop into the boundary scan cell and eliminating multiplexer delay from the functional data path.

While the invention has been particularly shown and described with reference to a preferred embodiment, it will be understood by those skilled in the art that various changes in form and detail may be made therein without departing from the spirit and scope of the invention.

What is claimed is:

1. A boundary scan cell comprising:
a shift latch, an update latch and a flushable latch that each have at least a respective data input and at least a respective data output, wherein said data output of said shift latch is coupled to said data input of said update latch, said data output of said update latch is selectively coupled to said data input of said flushable latch, and said data output of said flushable latch is selectively coupled to said data input of said shift latch and is non-selectively coupled to an integrated circuit I/O pin, wherein said flushable latch further includes at least one clock input coupled to receive at least one clock signal during at least a non-test mode, wherein during said non-test mode said flushable latch propagates a logic state change at its data input to its data output in response to a logic state change of said at least one clock signal; and control circuitry that controls operation of said flushable latch circuit and, responsive to a mode signal, selects, as input data for said flushable latch, one of a functional logic signal and a boundary scan signal, wherein if said mode sign indicates a test mode, said control circuitry selects said boundary scan signal as said input data and causes said flushable latch to flush through said input data to said data output of said flushable latch and to said integrated circuit I/O pin independently of any logic state change of said at least one clock signal;

wherein during both said test mode and said non-test mode, a logic state present at said data output of said flushable latch propagates to the integrated circuit I/O pin independently of any selection logic such that latency is reduced.

2. The boundary scan cell of claim 1, and further comprising a shift multiplexer coupled between said data output of said flushable latch and said data input of said shift latch wherein said shift multiplexer receives a data output signal of said flushable latch and shift latch output data from another boundary scan cell as inputs.

3. The boundary scan cell of claim 1, and further comprising a shift multiplexer coupled to said data input of said shift latch, wherein said shift multiplexer receives said functional logic signal and shift latch output data from another boundary scan cell as inputs.

4. The boundary scan cell of claim 1, and further comprising a scan path multiplexer having at least a first data input coupled to said data output of said update latch, a second data input coupled to a scan input signal and a data output coupled to a data input of said flushable latch.

5. The boundary scan cell of claim 1, wherein said flushable latch comprises a D flip-flop.

6. The boundary scan cell of claim 5, said control circuitry comprising:
a mode input;
a connection between said mode input and said D flip-flop; and
a mode multiplexer that selects between said boundary scan data and said functional logic signal at least partially in response to said mode signal.

7. The boundary scan cell of claim 1, wherein said flushable latch circuit comprises a shift register latch (SRL) having a plurality of clock inputs including said at least one clock input, and wherein said boundary scan cell further comprises clock splitter logic coupled to said plurality of clock inputs of said SRL, wherein said clock splitter logic causes said SRL to operate as a D flip-flop in non-test mode of operation by outputting a plurality of clock signals to said plurality of clock inputs of said SRL.

8. The boundary scan cell of claim 7, said at least a data input including a functional data input coupled to receive said functional logic signal and a test data input coupled to receive said boundary scan data.

9. The boundary scan cell of claim 1, wherein said boundary scan cell comprises an IEEE 1149.1-compatible boundary scan cell.

10. An integrated circuit chip, comprsing:
a substrate;
integrated circuitry formed within said substrate, said integrated circuitry including:
functional logic;
a buffer for communicating off-chip signals;
a boundary scan cell connected between said functional logic and said buffer that communicates a functional logic signal there between, said boundary scan cell including:
a shift latch, an update latch and a flushable latch that each have at least a respective data input and at least a respective data output, wherein said data output of said shift latch is coupled to said data input of said update latch, said data output of said update latch is selectively coupled to said data input of said flushable latch, and said data output of said flusbable latch is selectively coupled to said data input of said shift latch and is non-selectively coupled to said buffer, wherein said flushable latch further includes at least one clock input coupled to receive at least one clock signal during at least a non-test mode, wherein during said non-test mode said flushable latch propagates a logic state change at its data input to its data output in response to a logic state change of said at least one clock signal; and control circuitry that controls operation of said flushable latch circuit and, responsive to a mode signal, selects, as input data for said flushable latch, one of a functional logic signal and a boundary scan signal, wherein if said mode signal indicates a test mode, said control circuitry selects said boundary scan signal as said input data and causes said flushable latch to flush through said input data to said data output of said flushable latch and to said buffer independently of any logic state change of said at least one clock signal;

wherein during both said test mode and said non-test mode, a logic state present at said data output of said flushable latch propagates to the buffer independently of any selection logic such that latency is reduced.

11. The integrated circuit chip of claim 10, said boundary scan cell further comprising a shift multiplexer coupled between said data output of said flushable latch and said data input of said shift latch, wherein said shift multiplexer receives a data output signal of said flushable latch and shift latch output data from another boundary scan cell as inputs.

12. The integrated circuit chip of claim 10, said boundary scan cell further comprising a shift multiplexer coupled to said data input of said shift latch, wherein said shift multiplexer receives said functional logic signal and shift latch output data from another boundary scan cell as inputs.

13. The integrated circuit chip of claim 10, said boundary scan cell further comprsing a scan path multiplexer having at least a first data input coupled to said data output of said update latch, a second data input coupled to a scan input signal and a data output coupled to a data input of said flushable latch.

14. The integrated circuit chip of claim 10, wherein said flushable latch comprises a D flip-flop.

15. The integrated circuit chip of claim 14, said control circuitry comprising:
a mode input;
a connection between said mode input and said D flip-flop; and
a mode multiplexer that selects between said boundary scan data and said functional logic signal at least partially in response to said mode signal.

16. The integrated circuit chip of claim 10, wherein said flushable latch circuit comprises a shift register latch (SRL)

having a plurality of clock inputs including said at least one clock input, and wherein said boundary scan cell further comprises clock splitter logic coupled to said plurality of clock inputs of said SRL, wherein said clock splitter logic causes said SRL to operate as a D flip-flop in the non-test mode of operation by outputting a plurality of clock signals to said plurality of clock inputs of said SRL.

17. The integrated circuit of claim 16, said at least a data input including a functional data input coupled to receive said functional logic signal and a test data input coupled to receive said boundary scan data.

18. The integrated circuit chip of claim 10, wherein said boundary scan cell comprises an IEEE 1149.1-compatible boundary scan cell.

19. An apparatus, comprising:
   a circuit card and an integrated circuit chip mounted on said circuit card, said integrated circuit chip including:
   a substrate and integrated circuitry formed within said substrate, said integrated circuitry including:
   functional logic;
   a buffer for communicating off-chip signals; and
   a boundary scan cell connected between said functional logic and said buffer that communicates a functional logic signal there between, said boundary scan cell including:
      a shift latch, an update latch and a flushable latch that each have at least a respective data input and at least a respective data output, wherein said data output of said shift latch is coupled to said data input of said update latch, said data output of said update latch is selectively coupled to said data input of said flushable latch, and said data output of said flushable latch is selectively coupled to said data input of said shift latch and is non-selectively coupled to said buffer, wherein said flushable latch further includes at least one clock input coupled to receive at least one clock signal during at least a non-test mode, wherein during said non-test mode said flushable latch propagates a logic state change at its data input to its data output in response to a logic state change of said at least one clock signal; and
      control circuitry that controls operation of said flushable latch circuit and, responsive to a mode signal, selects, as input data for said flushable latch, one of a functional logic signal and a boundary scan signal, wherein if said mode signal indicates a test mode, said control circuitry selects said boundary scan signal as said input data and causes said flushable latch to flush through said input data to said data output of said flushable latch and to said buffer independently of any logic state change of said at least one clock signal;
      wherein during both said test mode and said non-test mode, a logic state present at said data output of said flushable latch propagates to the buffer independently of any selection logic such that latency is reduced.

20. The apparatus of claim 19, said boundary scan cell further comprising a shift multiplexer coupled between said data output of said flushable latch and said data input of said shift latch, wherein said shift multiplexer receives a data output signal of said flushable latch and shift latch output data from another boundary scan cell as inputs.

21. The apparatus of claim 19, said boundary scan cell further comprising a shift multiplexer coupled to said data input of said shift latch, wherein said shift multiplexer receives said functional logic signal and shift latch output data from another boundary scan cell as inputs.

22. The apparatus of claim 19, said boundary scan cell further comprising a scan path multiplexer having at least a first data input coupled to said data output of said update latch, a second data input coupled to a scan input signal and a data output coupled to a data input of said flushable latch.

23. The apparatus of claim 19, wherein said flushable latch comprises a D flip-flop.

24. The apparatus of claim 23, said control circuitry comprising:
   a mode input;
   a connection between said mode input and said D flip-flop; and
   a mode multiplexer that selects between said boundary scan data and said functional logic signal at least partially in response to said mode signal.

25. The apparatus of claim 19, wherein said flushable latch circuit comprises a shift register latch (SRL) having a plurality of clock inputs including said at least one clock input, and wherein said boundary scan cell further comprises clock splitter logic coupled to said plurality of clock inputs of said SRL, wherein said clock splitter logic causes said SRL to operate as a D flip-flop in the non-test mode of operation by outputting a plurality of clock signal to said plurality of clock inputs of said SRL.

26. The apparatus of claim 25, said at least a data input including a functional data input coupled to receive said functional logic signal and a test data input coupled to receive said boundary scan data.

27. The apparatus of claim 7, wherein said boundary scan cell comprises an IEEE 1149.1-compatible boundary scan cell.

* * * * *